United States Patent [19]

Hurng et al.

[11] Patent Number: 5,270,295

[45] Date of Patent: Dec. 14, 1993

[54] PROCESS FOR PREPARING SUPERCONDUCTORS AND COMPOSITIONS USEFUL THEREIN

[75] Inventors: Weir M. Hurng, Pingtung; Sheng F. Wu, Hsinchu Hsien; Cheng Y. Shei, Taipei Hsien; Yao T. Huang, both of Tainan Hsien, all of Taiwan

[73] Assignee: Industrial Technology Research Institute, Taiwan

[21] Appl. No.: 871,099

[22] Filed: Apr. 20, 1992

Related U.S. Application Data

[63] Continuation of Ser. No. 642,792, Jan. 18, 1991, abandoned.

[51] Int. Cl.$^5$ .................. C01F 11/02; C01F 17/00; C01G 3/02; H01L 39/24
[52] U.S. Cl. ........................ 505/1; 252/518; 252/521; 423/593; 505/725; 505/780
[58] Field of Search .............. 505/1, 737, 738, 780, 505/725; 423/604, 593; 501/123, 126, 152

[56] References Cited

U.S. PATENT DOCUMENTS

| | | | |
|---|---|---|---|
| 4,956,340 | 9/1990 | Kimura et al. | 505/738 |
| 4,962,088 | 10/1990 | Micheli et al. | 505/1 |
| 4,997,810 | 3/1991 | Spencer | 505/742 |
| 5,024,992 | 6/1991 | Morris | 501/152 |
| 5,149,683 | 9/1992 | Wada | 505/180 |

FOREIGN PATENT DOCUMENTS

| | | | |
|---|---|---|---|
| 0301592 | 2/1989 | European Pat. Off. | 505/738 |
| 1176203 | 7/1989 | Japan | 505/734 |
| 9104946 | 4/1991 | World Int. Prop. O. | 505/1 |

OTHER PUBLICATIONS

Jin "Synthesis and properties of the $YBa_2Cu_4O_8$ Superconductor" Physica C vol. 165 Feb. 15, 1990 pp. 415-418.

Murakami, et al. Jap. Journ. of Applied Physics vol. 29, No. 3 Mar., 1990, pp. L445-L446 Synthesis of $YBa_2Cu_4O_8$ Powders by Sol-Gel Method under Ambient Pressure.

Miyatake, et al. Physica C 160 (1989) pp. 541-544 Preparation and Superconducting Properties of $YBa_2Cu_4O_8$.

Balachandran, et al. Physica C 165 (1990) pp. 335-339 Synthesis of 80K Superconducting $YBa_2Cu_4O_8$ Via a Novel Route.

Morris, et al. Physical Review B vol. 39, No. 10 Apr. 1989 Eight new high-temperature superconductors with the 1:2:4 structure.

Niska, et al., Journal of Materials Science Letters 9 (1990) pp. 770-771 Formation of the 124 phase superconductor $YBa_2Cu_4O_8$ by retaining oxygen in a reaction HIP sintering process.

Cara "Synthesis of bulk superconducting $YBa_2Cu_yO_x$..." Nature vol. 338 Mar. 23, 1989 pp. 328-330.

Copper "High-Tc superconductivity oxide films produced ..." Math. Res. Soc. Symp. vol. 99 Nov./Dec. 1987 pp. 165-170.

Gupta "$YBa_2Cu_yO_x$ thin films grown by a simple spray ..." Appl. Phys. Lett. vol. 52(2) Jan. 11, 1988 pp. 163-165.

Hurng "Formation mechanism study of $REBa_2Cu_yO_x$..." Appl. Phys. Lett. vol. 57(19) Nov. 5, 1990 pp. 2025-2027.

Primary Examiner—Paul Lieberman
Assistant Examiner—John Boyd
Attorney, Agent, or Firm—Scully, Scott, Murphy & Presser

[57] ABSTRACT

A process for preparing a composition having the general formula $REBa_2Cu_4O_y$ where RE is a rare earth element such as dysprosium and including yttrium and the subscript "y" is about 8.0. The process utilizes nitric acid among the starting components to provide control over stoichiometry and minimize contamination. The present invention is also directed to a process of preparing a high purity superconductor utilizing the composition thus prepared. This process permits the superconductor to be prepared in a short time and at low sintering temperatures.

38 Claims, 6 Drawing Sheets

PROCESS FOR PREPARING SUPERCONDUCTORS AND COMPOSITIONS USEFUL THEREIN

This is a continuation of copending application Ser. No. 642,792, filed on Jan. 18, 1991, now abandoned.

BACKGROUND OF THE INVENTION

1. Field of the Invention

The present invention relates to a process for preparing compositions of the formula REBa wherein $REBa_2Cu_4O_y$ is a rare-earth element, including yttrium and dysprosium and subscript "y" is about 8.0. These compositions have particular utility in superconductors. The process of the instant invention utilizes nitric acid in the preparation of the compositions. The present invention further relates to a process of preparing a superconductor from these compositions.

2. Background of the Invention

Recently, $REBa_2Cu_4O_y$ (hereinafter referred to as RE-124, where RE is yttrium and/or dysprosium (Dy) and subscript "y" is about 8.0, has competed with $REBa_2Cu_3O_y$ 0 (hereinafter referred to as RE-123, where RE is yttrium and/or dypsrosium) as one of the most important superconductors being studied. Particular interest has focused on the advantages RE-124 has over RE-123. For example, although RE-123 generally manifests a higher superconducting temperature (Tc, generally expressed in units of Kelvin, K) than RE-124 (about 90K for RE-123, and about 80K for RE-124), it suffers from having high chemical reactivity as well as poor thermal stability. Thus when heated or stored for long periods of time, RE-123 decomposes, which decomposition results in a reduction in oxygen content and, consequently, a lowering of the superconducting temperature.

In contrast, RE-124 exhibits no such chemical reactivity and further has superior thermal stability due to its particular crystalline structure. Indeed, RE-124 will not decompose even at elevated temperatures, such as when heated up to 850° C. As a result RE-124 does not suffer a loss of oxygen with the attendant depression of the superconducting temperature, which behavior is important for practical applications. Moreover, the superconducting temperature of RE-124 can be raised to about 90K —the approximate superconducting temperature of RE-123—by doping with a suitable amount of calcium. So marked are the advantages inherent in RE-124 that even its use as a precursor, i.e., a decomposition precursor, in the preparation of RE-123 has benefits: products thus made will exhibit higher hysteresis, as well as higher critical current density. Furthermore, RE-123 prepared using RE-124 as a decomposition precursor exhibits shielding effects which are superior to those exhibited by RE-123 prepared by any other process.

The known processes for manufacturing RE-124 high Tc superconductors fall into two general categories, namely: a high oxygen pressure process and an ambient oxygen pressure process. Literature related to the high oxygen pressure process include:

a) J. Karpinski, et al., *Nature*, 336, Dec. 15, 1988, pp. 660–662 report the synthesis of bulk RE-124 phase in oxygen at a pressure of 400 bar and a temperature of 1,040° C.

b) D. E. Morris, et al., *Phys. Rev. B.*, 39, No. 10, pp. 7347–7350 (1989) report that an RE-124 (more particularly, Y-124) was sintered in high pressure oxygen (the pressure of $O_2$ being approximately 120 atmospheres) at 930° C. for 8 hours using a commercial high-pressure oxygen furnace.

c) T. Miyatake, et al., *Physica C.*, 160, pp. 541–544 (1989) describe a sample preparation of RE-124 by a solid state reaction method using the oxygen-HIP treatment. Starting materials were calcined at 900° C. in flowing oxygen for 12 hours. The powder compact was sintered at 800° C. in flowing oxygen. The oxygen-HIP treatment was repeated twice in an argon-oxygen gas environment (Argon +20% oxygen) at a pressure of 100MPa. The first treatment was at 950° C. for 6 hours; the second at 1050° C. for 3 hours The disadvantages common to these methods include the need for a high pressure oxygen furnace and the need for reaction temperatures over 900° C. These requirements increase production costs and are unfavorable for mass production, thus making the high oxygen pressure process unattractive for practical applications.

Literature related to the ambient oxygen pressure process include:

a) R. J. Cava, et al., *Nature*, 338, pp. 328–330 (1989) report a method of using $Y(NO_3)_3 \cdot xH_2O$, $Ba(NO_3)_2$ and $Cu(NO_3)_2 \cdot xH_2O$ as starting materials which, after slow preheating and pulverizing, are mixed with an approximately equal volume of $Na_2CO_3$ or $K_2CO_3$ to catalytically enhance the reaction rate. The carbonate mixture is ground and heated at 800° C. for 3 days. However, the hydrated nitrates are hygroscopic, making the control of the stoichiometry difficult. In addition, impurities can be introduced by adding $Na_2CO_3$ or $K_2CO_3$, thus complicating the whole process.

b) S. Jin, et al., *Physica C.*, 165, pp. 415–418 (1989) describe a synthesis route using $YBa_2Cu_3O_7$ (the formula corresponds to RE-123 where RE is yttrium: Y-123) as a precursor. The Y-123 was mixed with CuO. Sintering was at 810°–830° C. for 3 days and was repeated 3–4 times. The disadvantages of this process include the need for a Y-123 precursor and the lengthy sintering time.

c) D. M. Pooke, et al., *Phys. Rev. B.*, 41, No. 10 pp. 6616–6620 (1990) report a process which comprises mixing stoichiometric proportions of $Y_2O_3$, $Ba(NO_3)_2$, and CuO with up to a 0.2 mol fraction of $NaNO_3$ or $KNO_3$; prereacting the mixture as a loose powder for 30 min; then grinding, die pelleting and reacting at 800° C. for at least 12 hours in flowing oxygen. Phase purity is improved with repeated grinding and sintering. The disadvantages of this process include the use of alkali nitrates which are known to introduce impurities and the lengthy sintering time.

Thus despite intensive research efforts, the problems attendent current methods of preparing RE-124 demonstrate that a need for a more efficient process exists.

SUMMARY OF THE INVENTION

The present invention is directed to a process for preparing a composition of the general formula $REBa_2Cu_4O_y$, where RE represents one or more rare earth elements of atomic numbers 57 to 71, including yttrium, and subscript "y" is about 8.0. Compositions having this formula include the material known as RE-124; that is, the composition where RE is yttrium and/or dysprosium. The process of the instant invention comprises the steps of heating a mixture of at least one rare earth oxide, at least one barium compound, at least one copper oxide, nitric acid and optionally, water; the heating is under conditions sufficient to dry the mixture. The dry mixture is then calcined at a temperature of at least about 700° C. for a time of at least about 3 hours to obtain the desired composition.

Advantageously, the process of the instant invention permits more ready control over the stoichiometry of the starting materials than has heretofore been possible. This control is believed related to the presence of nitric acid, the use of which eliminates the contamination problems of prior art processes, such as contamination attributable to alkali nitrates, carbonates and the like, as caused by cations related to these materials.

The present invention is further directed to the preparation of a superconductor—such as an RE-124 superconductor—utilizing the compositions formed by the present process. The preparation of the superconductor, in accordance with the present invention, comprises the steps of compacting the composition thus prepared, followed by sintering the compacted composition under conditions sufficient to form a superconductor.

Notably, the preparation of the superconductor in accordance with the present invention utilizes lower sintering temperatures and shorter sintering times than previously possible. Moreover, the superconductor process of the instant invention requires fewer pulverizing and compacting, or pelletizing, steps than heretofore required. The overall result is that the superconductor preparation process of the subject invention requires less expensive equipment, reduces utility costs and can be readily adapted to large scale production —all the while maintaining the requisite high phase purity.

Although the scope of the processes of the present invention is independent of any theory explaining its superior effects, it is theorized that these effects are related to a catalytic-like action on the part of the nitric acid.

DETAILED DESCRIPTION OF THE INVENTION

The starting materials employed in the practice of the present invention consist of at least one rare earth oxide, at least one barium compound, at least one copper oxide, and nitric acid ($HNO_3$).

Rare earth oxides useful in the present invention include oxides formed from one or more of the rare earth elements having atomic numbers 57 to 71, including yttrium. In the preferred practice of the invention oxides of dysprosium (Dy) and/or yttrium (Y) —$Dy_2O_3$ and $Y_2O_3$, respectively—are used.

Barium compounds useful in the practice of the present invention include barium compounds which contain oxygen. Especially useful in this regard are barium nitrate ($Ba(NO_3)_2$), barium oxide (BaO) and barium carbonate ($BaCO_3$).

The copper oxides useful in the practice of the present invention include copper compounds which contain oxygen. In the practice of the invention, copper (II) oxide (CuO) is preferred.

In the preferred practice of the invention the rare earth oxide, the barium compound and the copper oxide all have a purity of at least 99%, more preferably greater than 99%.

Water, though not necessary in the practice of the present invention, may be present among the starting materials. Indeed, in the preferred practice of the invention, water is present, resulting in an enhancement of overall processing parameters. These include a shorter sintering time when the composition thus produced is fabricated into a superconductor. Deionized water is especially preferred.

Procedurally, in the process of the invention for the preparation of the composition having the formula $REBa_2Cu_4O_y$ wherein the subscript "y" is about 8.0, the at least one rare earth oxide, the at least one barium compound and the at least one copper oxide are mixed in amounts corresponding to a molar ratio of rare earth to barium to copper, respectively, of about 1:2:4. Nitric acid, and water if present, may be included in this initial charge, but is preferable to add these components subsequent to forming the mixture containing the rare earth, barium and copper.

The nitric acid is added in an amount which is proportional to the amount of rare earth cation present in the mixture, the proportion being about 0.00005 to about 0.003 moles of rare earth, to about 0.5 to about 3.0 moles of nitric acid. Preferably, this proportion is about 0.00075 to about 0.0025 moles of rare earth to about 0.1 to about 2.8 moles of nitric acid. More preferably, this proportion is about 0.001 to about 0.002 moles of rare earth to about 1.2 to about 2.4 moles of nitric acid.

Water, when added to the mixture, is added in an amount of up to about 7.0 moles of water per mole of nitric acid. Preferably, this ratio is between about 0.5 to about 3.0 moles of water per mole of nitric acid. More preferably, this ratio is between about 1.6 to about 4.0 moles of water per mole of nitric acid.

The mixture, containing the nitric acid and water, if present, is then heated. Heating is continued, preferably with stirring, until the mixture is dry. The mixture at this point is generally gray in color. The dry mixture is then calcined to yield the composition. Calcining is for a time of at least about 3 hours, preferably from about 3 to about 8 hours. More preferably, from about 4 to about 6 hours. Calcining temperature is at least about 700° C.; preferably about 720° C. to about 780° C.; most preferably about 750° C. Calcining is preferably performed in the presence of oxygen, more preferably flowing oxygen ($O_2$) After calcining, the composition having the general formula $REBa_2Cu_4O_y$, generally present in the form of a black powder, is recovered.

In further accordance with the present invention a process to prepare a practical, high purity $REBa_2Cu_4O_y$ superconductor from the composition thus prepared, is disclosed. Procedurally, for this aspect of the present invention, the composition obtained is compacted, preferably pelletized, and then sintered to form the superconductor. In the practice of this embodiment of the present invention, it may be necessary to pulverize the obtained composition prior to compaction so as to ensure uniformity and facilitate handleability.

The compacted composition is sintered under conditions sufficient to provide a superconductor having practical application. Sintering is normally accomplished at a temperature of at least about 790° C. for a time of at least about 25 hours. Preferably, sintering is performed at a temperature of about 800° C. to about 810° C. More preferably the sintering temperature is about 805° C. As to time, sintering is preferably carried out for a time period of about 30 to about 55 hours. More preferably, the sintering time is about 31 to about 33 hours. The sintering step is preferably performed in the presence of oxygen; more preferably flowing oxygen. Upon completion of the sintering step a high purity superconductor is obtained.

In a preferred embodiment of preparing a superconductor in accordance with the present invention, the sintering step is performed in stages, the accumulated time for which is the sintering time. Sintering in stages permits the composition to be periodically pulverized and re-compacted. This facilitates complete and uniform exposure of the composition to the sintering operation. Thus in the practice of this embodiment, the compacted composition is pulverized and re-compacted—into pellets, for example—between each stage, until the final sintering stage, wherefrom the superconductor is recovered, is reached.

In a preferred aspect of this embodiment, the sintering is performed in two stages wherein approximately midway through the total sintering time, the compacted composition is removed from the sintering environment, pulverized, re-compacted and returned to the sintering environment for the balance of the sintering time. Upon completion, a high purity superconductor is obtained.

The following examples are offered to assist in the understanding of the present invention and are not intended to limit the scope thereof.

EXAMPLE 1

Five samples, (a)–(e), were prepared as follows:
Into five separate beakers were charged 0.248g $Y_2O_3$ (commercially available from Cerac), 1.150g $Ba(NO_3)_2$ (commercially available from Merk), and 0.700g CuO (commercially available from Merk); all had a purity of greater than 99%. These materials were mixed and the following amounts of $HNO_3$ were added to each of the five beakers, respectively, to generate Samples (a)–(e):

Sample (a): no $HNO_3$ added.
Sample (b): 25 ml $HNO_3$ (approximately 0.6 moles).
Sample (c): 50 ml $HNO_3$ (approximately 1.2 moles).
Sample (d): 75 ml $HNO_3$ (approximately 1.8 moles).
Sample (e): 100 ml $HNO_3$ (approximately 2.4 moles).

De-ionized water was added in the following amounts so that the liquid volume ($HNO_3$ plus water) equalled 100 mls for each sample.

Sample (a): 100 ml de-ionized water (approximately 5.6 moles).
Sample (b): 75 ml de-ionized water (approximately 4.2 moles).
Sample (c): 50 ml de-ionized water (approximately 2.8 moles).
Sample (d): 25 ml de-ionized water (approximately 1.4 moles).
Sample (e): no de-ionized water added.

The Samples (a)–(e) were then heated, while stirred, until dry. In each of Samples (a)–(e), a gray-colored mixture was obtained. Each of Samples (a)–(e) were then calcined at 750° C. for 4 hours in the presence of flowing oxygen. Each of the samples yielded a black powder. The black powders of Samples (a)–(e) were then analyzed using X-Ray Diffraction (XRD) techniques, the results of which are shown in FIG. 1.

Figure 1:
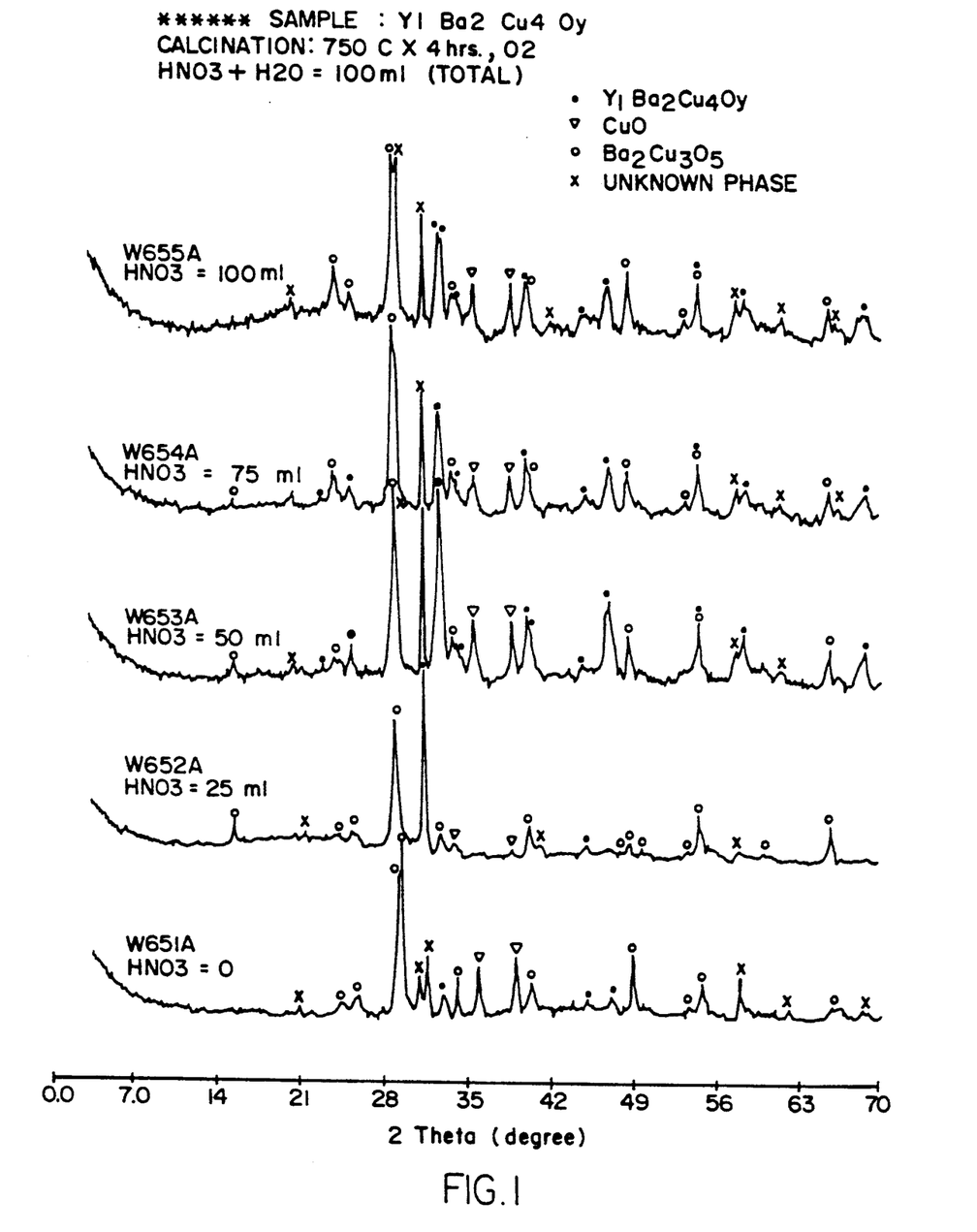
FIG. 1 is an X-Ray Diffraction (XRD) pattern of Y-124 as prepared according to the present invention. Calcining was at 750° C. for 4 hours.

Reference to FIG. 1 shows that $Ba_2Cu_3O_5$ and CuO are the predominant phases and that when the $HNO_3$ addition was 50 mls or more (which corresponded to a nitric acid to yttrium molar ratio of about 1.2 to 2.4 moles of nitric acid to approximately 0.0022 moles of yttrium), a composition having the formula $YBa_2Cu_4O_y$, (also known as Y-124) begins to appear.

The powders of Samples (a)–(e) were then pulverized and compacted under a pressure of 100 kgf/cm² into pellets having a diameter of 10 mm. The pellets corresponding to Samples (a)–(e) were then sintered at a temperature of 805° C. for 15 hours in the presence of flowing oxygen. The resultant pellets were then analyzed by XRD, the results of which are shown in FIG. 2.

Figure 2:
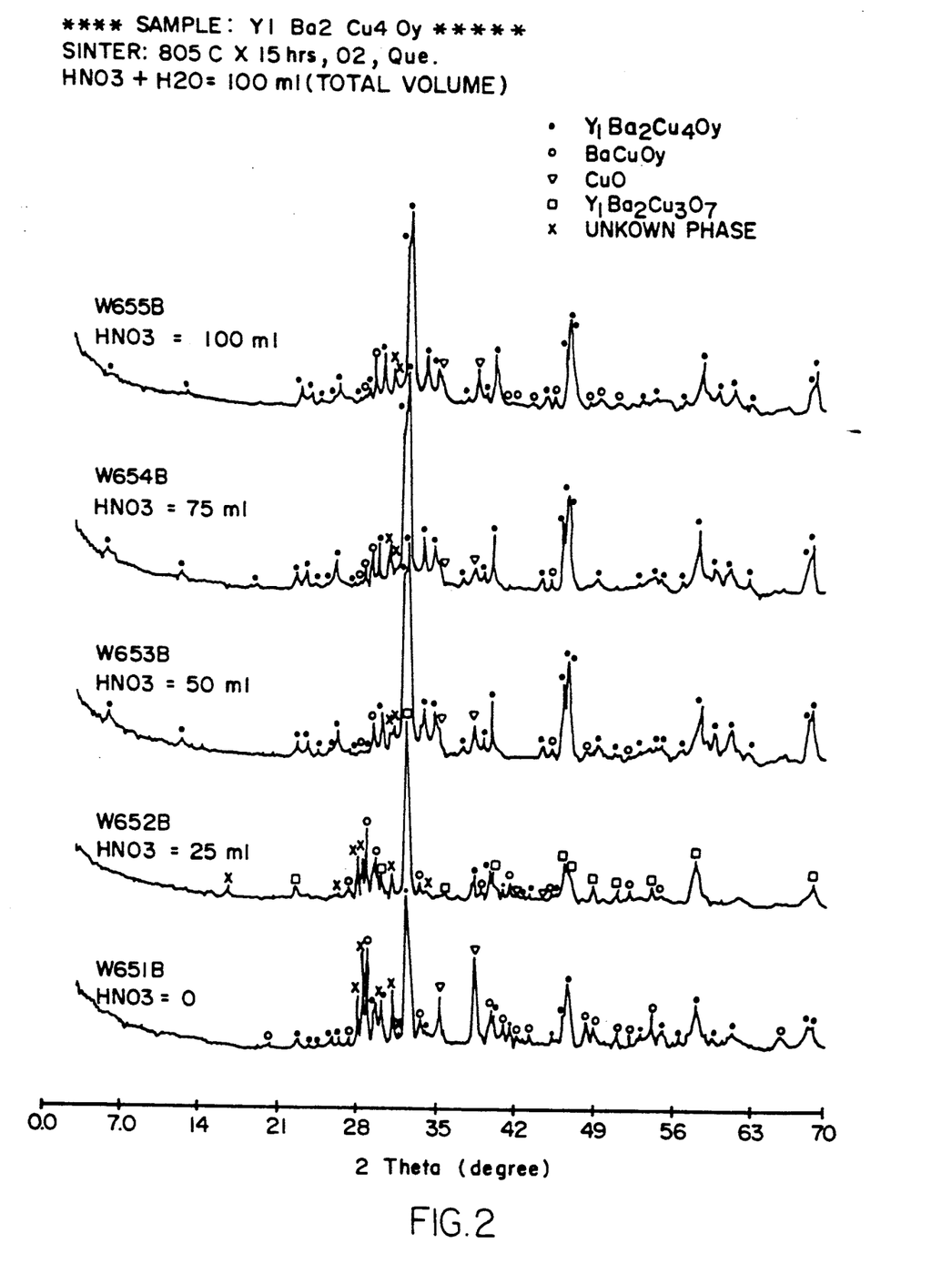
FIG. 2 is an X-Ray Diffraction (XRD) pattern of Y-124 as prepared according to the present invention. Sintering was at 805° C. for 15 hours.

Reference to FIG. 2 shows that where the addition of $HNO_3$ was 50 mls or more, as in Samples (c), (d) and (e) (which corresponded to a nitric acid to yttrium molar ratio of about 1.2 to 2.4 moles of nitric acid to about 0.0022 moles of yttrium), the yield of Y-124 phase increases rapidly.

The pellets of Samples (a)–(e) were pulverized and pelletized for a second time, the conditions being the same as the first time, and were sintered again at 805° C. for 18 hours in the presence of flowing oxygen the cumulative sintering time at this point was 33 hours). The resultant pellets were analyzed by XRD. The results are shown in FIG. 3.

Figure 3:
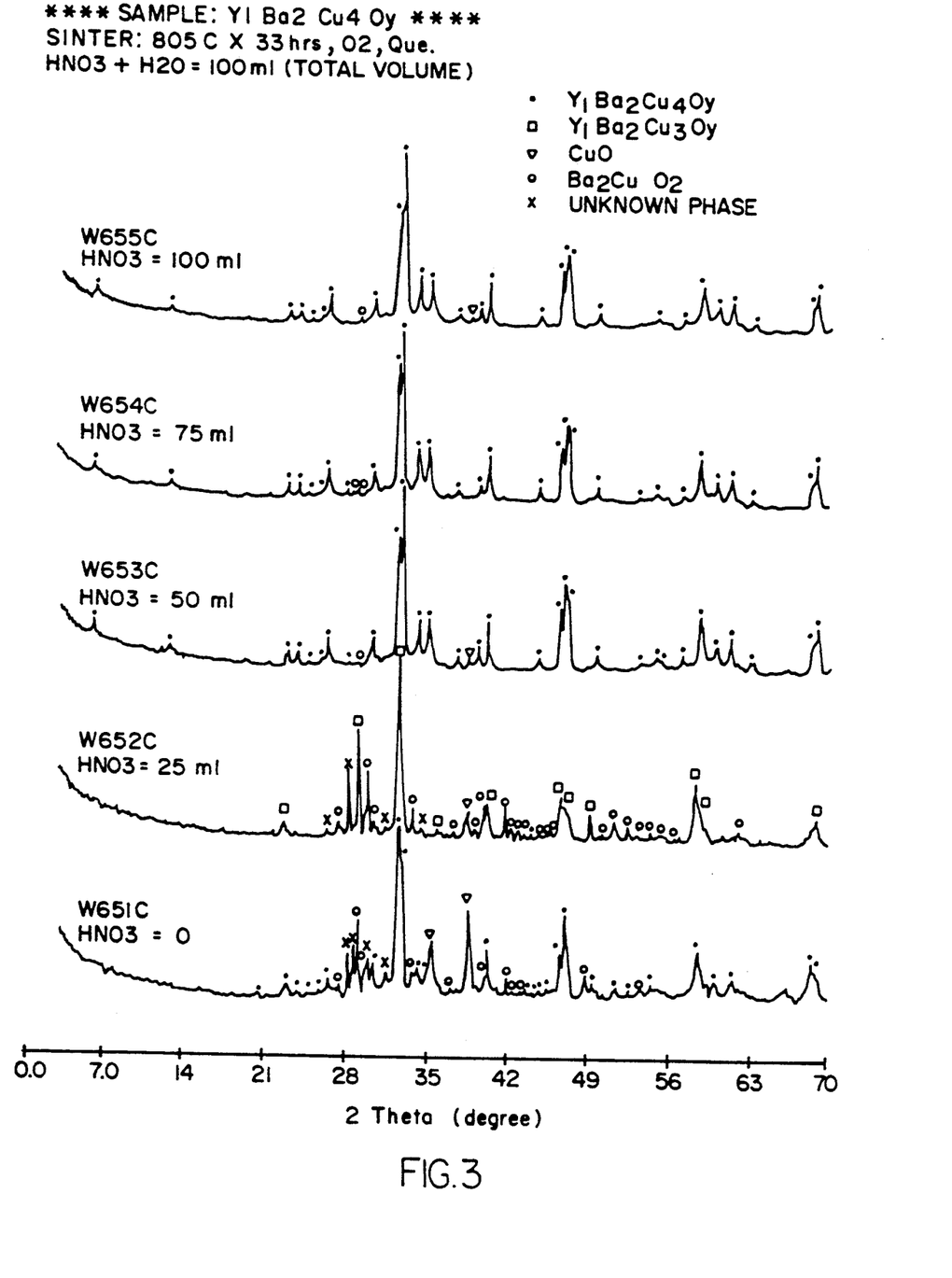
FIG. 3 is an X-Ray Diffraction (XRD) pattern of Y-124 as prepared according to the present invention. Sintering was at 805° C. for 33 hours.

Reference to FIG. 3 shows that when the addition of $HNO_3$ was 50 mls, Sample (c), (which corresponded to a nitric acid to yttrium molar ratio of about 1.2 moles of nitric acid to about 0.0022 moles of yttrium) the result was nearly single phase Y-124. For Samples (d) and (e) the result was similar: near Y-124 single phase was obtained. Samples (d) and (e) (75 mls and 100 mls of $HNO_3$, respectively, the corresponding nitric acid to yttrium molar ratios were about 1.8 moles of nitric acid to about 0.0022 moles of yttrium for Sample (d), and about 2.4 moles of nitric acid to about 0.0022 moles of yttrium for Sample (e)) are shown in FIG. 3 as not having been completely reacted. Samples (a) and (b) (0 mls and 25 mls of HN03, respectively) did not show the appearance of Y-124 phase.

The pellets of Samples (a)–(e) were sintered further at 805° C. for 15 hours in the presence of flowing oxygen (the total accumulated sintering time was 48 hours). The pellets were recovered and analyzed by XRD, the results are shown in FIG. 4.

Figure 4:
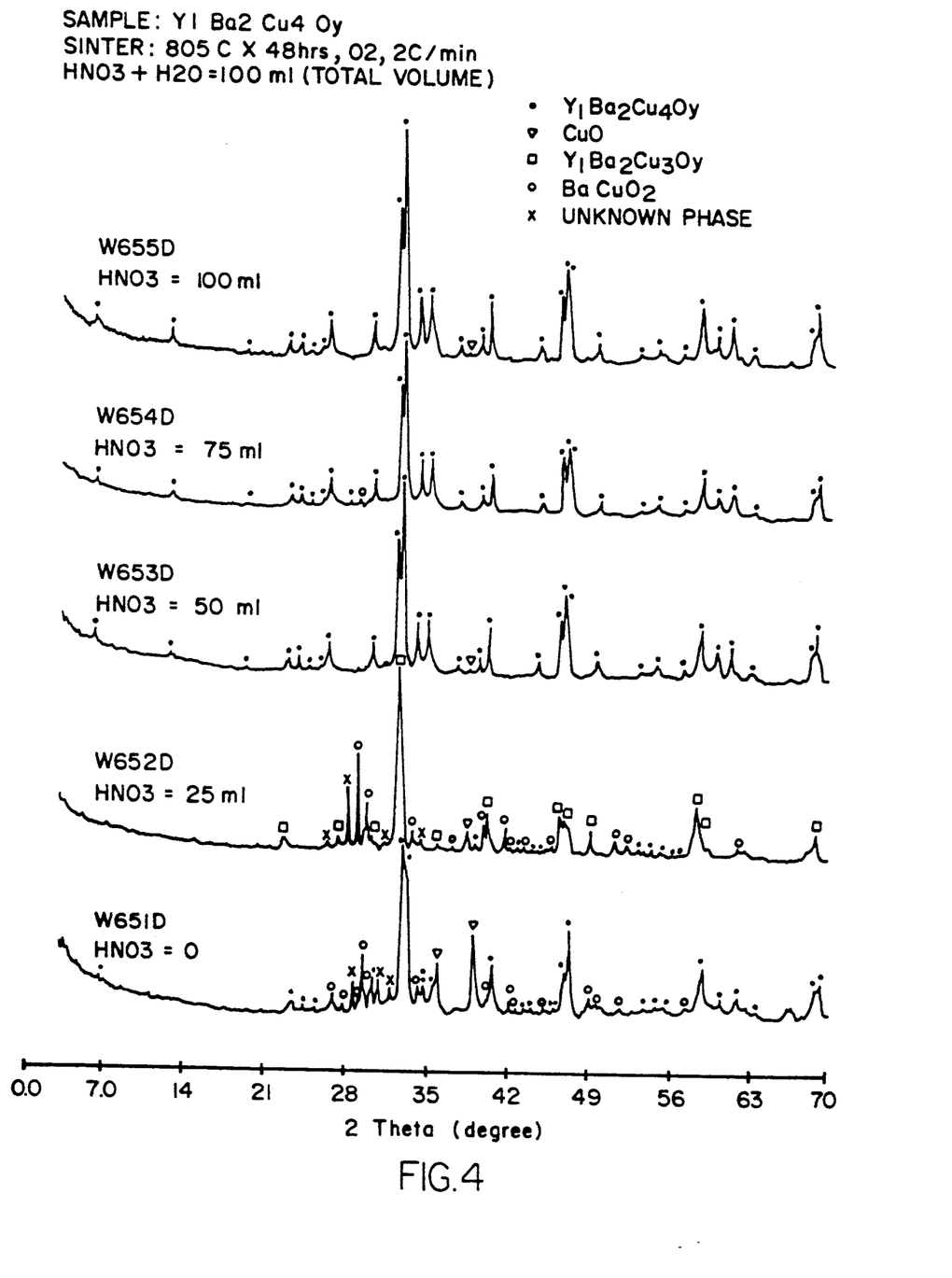
FIG. 4 is an X-Ray Diffraction (XRD) pattern of Y-124 as prepared according to the present invention. Sintering was at 805° C. for 48 hours.

Reference to FIG. 4 shows that Samples (d) and (e) now yielded almost solely Y-124 after the sintering time had totalled 48 hours. Samples (a) and (b) did not show the emergence of a Y-124 phase even after 48 hours of sintering.

The pellets of Samples (a)–(e) thus obtained were tested with a Superconducting Quantum Interference Device (SQUID) for diamagnetism and superconducting temperature, Tc. The results are shown in FIG. 6.

Figure 6:
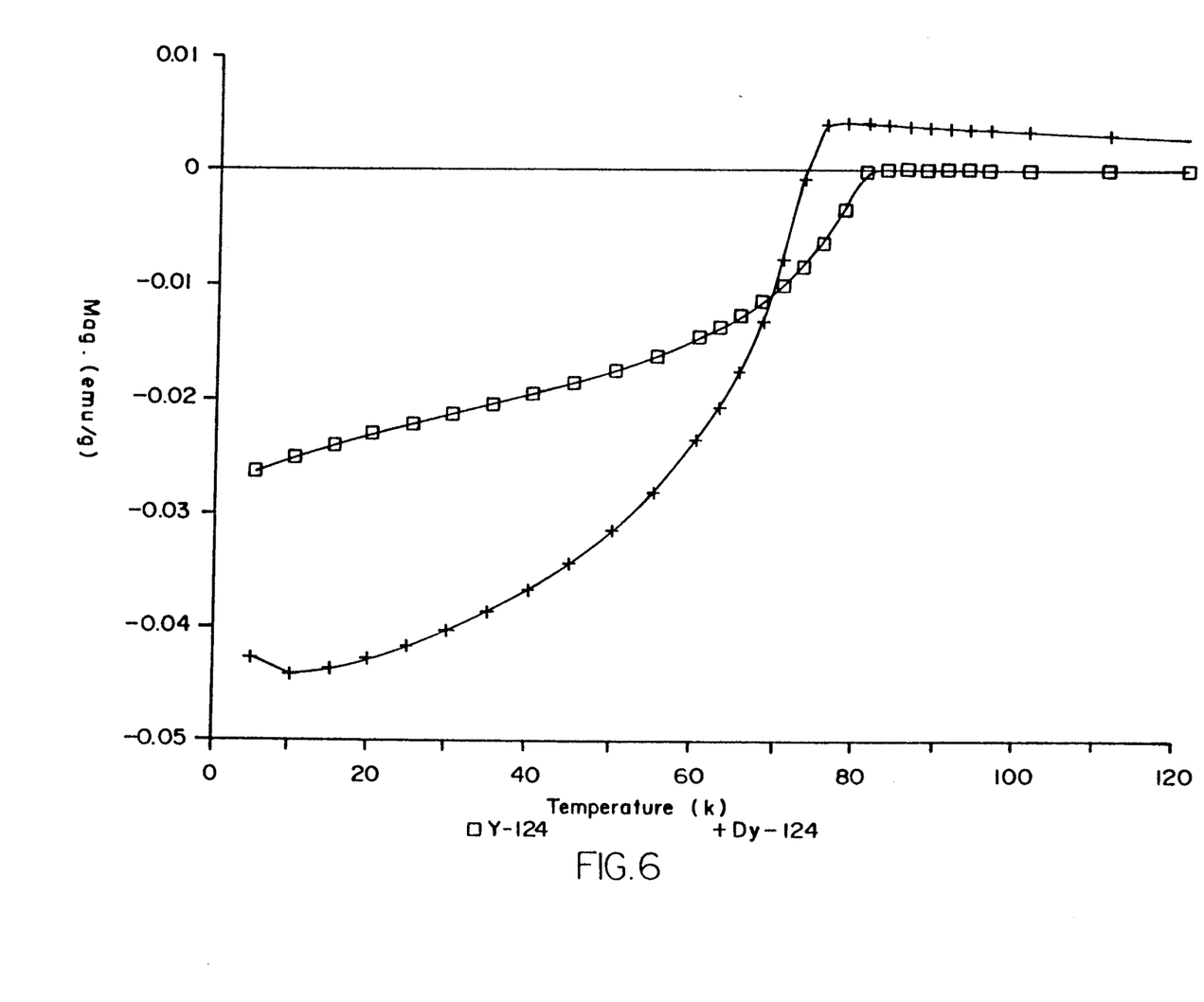
FIG. 6 illustrates the temperature dependence magnetization curves of Y-124 and Dy-124. The superconducting temperatures of Y-124 and Dy-124 are shown to be 80K and 75K, respectively.

Reference to FIG. 6 shows that the superconducting temperature, Tc (in degrees of Kelvin, K) of the Y-124 prepared in accordance with Example 1 was 80K. This value is in accord with that which is published in the literature.

EXAMPLE 2

The following materials were charged into a beaker: 0.208 g $Dy_2O_3$ (commercially available from Cerac), 0.440 g $BaCO_3$ (commercially available from Merk), and 0.355 g CuO (commercially available from Merk); all had a purity greater than 99%. These materials were mixed and 30 mls of $HNO_3$ (approximately 0.7 moles), corresponding to a nitric acid to dysprosium molar ratio of about 0.7 to 0.001, was added Deionized water was then added in an amount of 60 mls to dilute the $HNO_3$ to a total solution volume of 90 mls.

The sample was heated, while stirred, until dry. A gray-colored mixture was obtained. The mixture was then calcined at 750° C. for 6 hours in the presence of flowing oxygen; a black powder resulted. The black powder thus obtained was pulverized and compacted into a pellet having a 10 mm diameter.

The pellet was then sintered at 805° C. in the presence of flowing oxygen for time periods of 6 hours, 14.5 hours, 30.5 hours and 54 hours cumulatively. XRD analysis was performed after each sintering period; the results are shown in FIG. 5.

Figure 5:
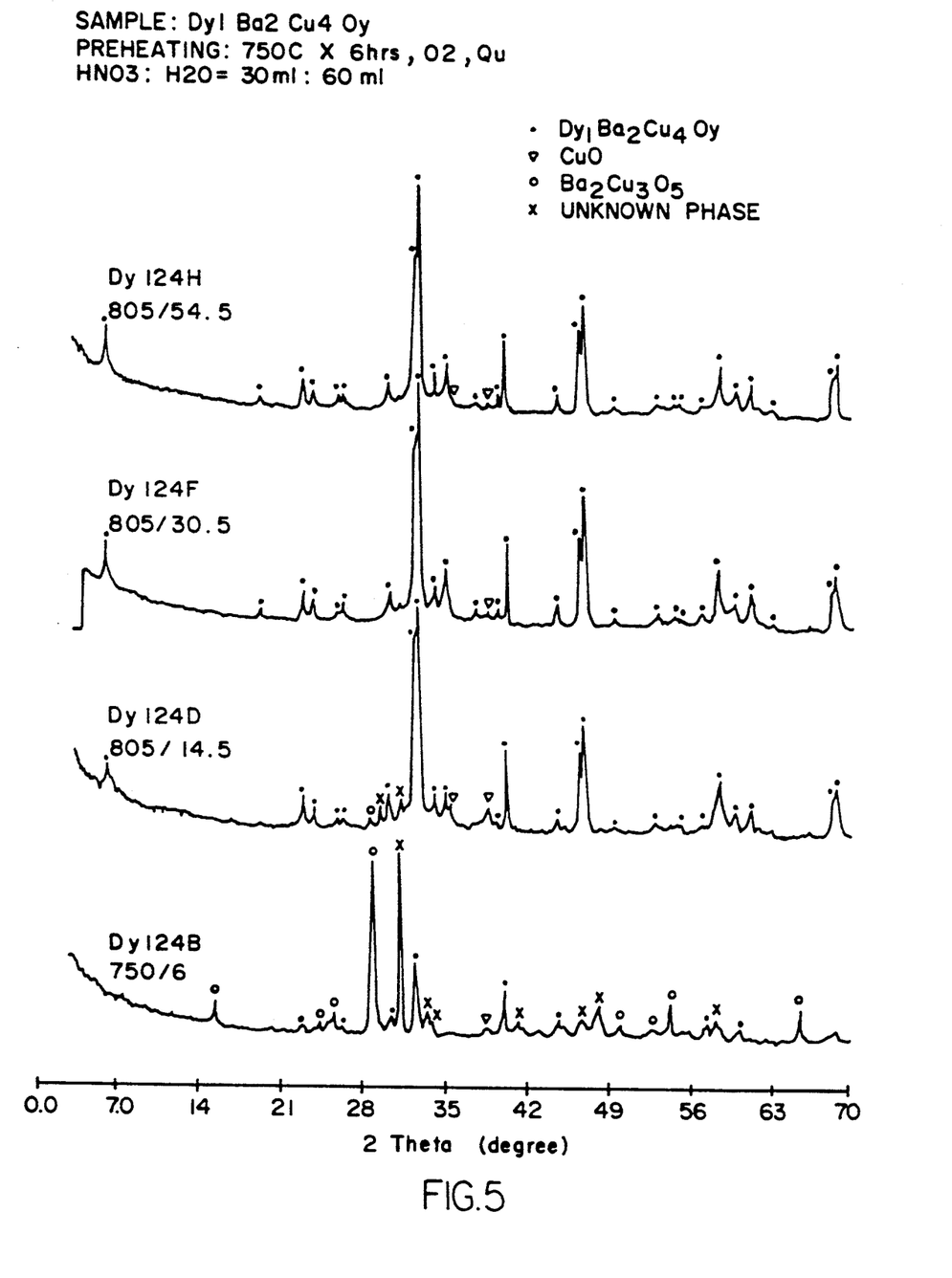
FIG. 5 is an X-Ray Diffraction (XRD) pattern of Dy-124 as prepared according to the present invention. Sintering was at 805° C. for periods of 6 hours, 14.5 hours, 30 hours and 54, cumulatively.

Reference to FIG. 5 shows that a nearly single phase of the composition having the formula $DyBa_2Cu_4O_y$, known as Dy-124, was obtained when the sample was sintered at 805° C. for 30.5 hours. FIG. 5 also shows that when the sintering time was increased to 54 hours, the phase content of Dy-124 remained substantially unchanged.

SQUID measurement showed the superconducting temperature, Tc of the Dy-124 thus prepared was 75K. This result is shown in FIG. 6. This value of Tc is in accord with that which is published in the literature.

In conclusion, the present invention is characterized by using $HNO_3$ as a reaction enhancer which permits the preparation of compositions having the general formula $REBa_2Cu_4O_y$, such as Y-124 and Dy-124, and superconductors using these compositions in much shorter times, at lower temperatures and with simplified operation. Consequently, expensive equipment is not required and production cost is reduced. Further, the stoichiometries are easily controlled since hygroscopic hydrated nitrates are not used as starting materials, and no alkali metal impurities are introduced because no alkali carbonates or nitrates are added.

What is claimed is:

1. A process for preparing a composition of the formula $REBa_2Cu_4O_y$ wherein RE is a rare earth element of atomic number 57 to 71 and including yttrium wherein the subscript "y" is about 8.0, said process comprising the steps of:

(a) heating a mixture of nitric acid, at least one rare earth oxide, at least one barium compound, and at least on copper oxide wherein the molar ratio of rare earth to nitric acid is from about 0.00075 to about 0.0025 moles of rare earth to about 0.1 to about 2.8 moles of nitric acid, said heating being conducted under conditions sufficient to dry said mixture; and (b) calcining said dry mixture under conditions sufficient to obtain said composition.

2. The process of claim 1 wherein said mixture further comprises water.

3. The process of claim 2 wherein said water is deionized.

4. The process of claim 1 wherein said at least one rare earth oxide, said at least one barium compound and said at least one copper oxide have a purity of at least 99%.

5. The process of claim 1 wherein Step (a) further comprises agitating said mixture while heating.

6. The process of claim 1 wherein said at least one rare earth oxide contains at least one element of atomic number 57 to 71, yttrium or mixtures thereof.

7. The process of claim 6 wherein said at least one rare earth oxide is $Dy_2O_3$, $Y_2O_3$ or mixtures thereof.

8. The process of claim 1 wherein said at least one barium compound contains oxygen.

9. The process of claim 8 wherein said at least one barium compound is $Ba(NO_3)_2$, BaO, $BaCO_3$ or mixtures thereof.

10. The process of claim 1 wherein the molar ratio of rare earth in the at least one rare earth oxide, to barium in the at least one barium compound, to copper in the at least one copper oxide is about 1:2:4.

11. The process of claim 10 wherein the molar ratio of rare earth in the at least one rare earth oxide to nitric acid is about 0.001 to about 0.002 moles of rare earth to about 1.2 to about 2.4 moles of nitric acid.

12. The process of claim 2 wherein said water is present in an amount of about 7.0 moles of water per mole of nitric acid.

13. The process of claim 12 wherein said water is present in an amount of about 0.5 to about 3.0 moles of water per mole of nitric acid.

14. The process of claim 13 wherein said water is present in an amount of about 1.6 to about 4.0 moles of water per mole of nitric acid.

15. The process of claim 1 wherein said calcining is for a time of at least about 3 hours.

16. The process of claim 15 wherein said calcining is for a time of about 3 to about 8 hours.

17. The process of claim 16 wherein said calcining is for a time of about 4 to about 6 hours.

18. The process of claim 1 wherein said calcining is at a temperature of at least about 700° C.

19. The process of claim 18 wherein said calcining is at a temperature of about 720° C. to about 780° C.

20. The process of claim 19 wherein said calcining is at a temperature of about 740° C. to about 760° C.

21. The process of claim 18 wherein said calcining is at a temperature of about 750° C.

22. The process of claim 1 wherein said calcining is in the presence of oxygen.

23. The process of claim 22 wherein said oxygen is flowing.

24. The process of claim 1, including the following additional steps of:

(c) compacting the calcined composition of Step (b); and (d) sintering said compacted composition under conditions sufficient to provide said superconductor.

25. The process of claim 26 wherein Step (c) further comprises pulverizing said composition prior to compacting.

26. The process of claim 4 wherein said compacting forms said composition into pellets.

27. The process of claim 4 wherein said sintering is at a temperature of at least about 790° C.

28. The process of claim 7 wherein said sintering is at a temperature of about 800° C. to about 810° C.

29. The process of claim 28 wherein said sintering is at a temperature of about 805° C.

30. The process of claim 24 wherein said sintering is for a time of at least about 25 hours.

31. The process of claim 30 wherein said sintering is for a time of about 30 to about 55 hours.

32. The process of claim 32 wherein said sintering is for a time of about 31 to about 33 hours.

33. The process of claim 34 wherein said sintering is in the presence of oxygen.

34. The process of claim 33 wherein said oxygen is flowing.

35. The process of claim 34 wherein said sintering is performed in stages, the compacted composition being pulverized and re-compacted between each sintering stage.

36. The process of claim 35 wherein said sintering is performed in two stages, the compacted composition being pulverized and recompacted after the first sintering stage, said superconductor being recovered after said second sintering stage.

37. The process of claim 36 wherein said first sintering stage and said second sintering stage are performed at approximately the same conditions of temperature and time.

38. The process of claim 36 wherein said second sintering stage is for a longer period of time than the first sintering stage.

* * * * *

UNITED STATES PATENT AND TRADEMARK OFFICE
CERTIFICATE OF CORRECTION

PATENT NO. : 5,270,295
DATED : December 14, 1993
INVENTOR(S) : Weir M. Hurng, et al.

It is certified that error appears in the above-indentified patent and that said Letters Patent is hereby corrected as shown below:

On the Title Page, Column 2, line 18: "Math." should read --Mat.--

Column 1, lines 12-13: "REBa wherein $REBa_2Cu_4O_y$ is a" should read --$REBa_2Cu_4O_y$ wherein RE is a--

Column 1, line 22: after "yttrium" insert --(Y)-

Column 1, line 24: delete "O"

Column 6, line 42: "the" should read --(the--

Column 6, line 59: "HNO3" should read --$HNO_3$--

Column 8, line 57, Claim 21: "claim 18" should read --claim 20--

Column 9, line 1, Claim 25: "claim 26" should read --claim 24--

Column 9, line 4, Claim 26: "claim 4" should read --claim 24--

Column 9, line 6, Claim 27: "claim 4" should read --claim 24--

UNITED STATES PATENT AND TRADEMARK OFFICE
CERTIFICATE OF CORRECTION

PATENT NO. : 5,270,295
DATED : December 14, 1993
INVENTOR(S) : Weir M. Hurng, et al.

It is certified that error appears in the above-indentified patent and that said Letters Patent is hereby corrected as shown below:

Column 9, line 8, Claim 28: "claim 7" should read --claim 27--

Column 9, line 16, Claim 32: "claim 32" should read --claim 31--

Column 9, line 18, Claim 33: "claim 34" should read --claim 24--

Column 10, line 3, Claim 35: "claim 34" should read --claim 24--

Signed and Sealed this

Twenty-sixth Day of July, 1994

Attest:

BRUCE LEHMAN

*Attesting Officer*  *Commissioner of Patents and Trademarks*